United States Patent [19]

Koblenzer

[11] Patent Number: 4,471,792
[45] Date of Patent: Sep. 18, 1984

[54] APPARATUS FOR THE TREATMENT OF ARTICLES WITH A VOLATILE LIQUID

[75] Inventor: Heinz Koblenzer, Filderstadt, Fed. Rep. of Germany

[73] Assignees: LPW Reinigungstechnik GmbH, Filderstadt; Robert Bosch GmbH, Stuttgart, both of Fed. Rep. of Germany

[21] Appl. No.: 442,748

[22] Filed: Nov. 18, 1982

[51] Int. Cl.³ .............................................. B08B 3/02
[52] U.S. Cl. ..................................... 134/83; 134/143
[58] Field of Search ................ 134/83, 140, 143, 154, 134/164, 183

[56] References Cited

U.S. PATENT DOCUMENTS 2,972,352  2/1961  Ipsen ................................. 134/83 X
4,313,323  2/1982  Kanemitsu ............................. 72/84

FOREIGN PATENT DOCUMENTS 1621562  3/1980  Fed. Rep. of Germany ...... 134/143

Primary Examiner—Robert L. Bleutge
Attorney, Agent, or Firm—Karl F. Ross; Herbert Dubno

[57] ABSTRACT

An apparatus for the treatment of articles especially metal articles with a solvent, e.g. for the degreasing of the articles, comprises an upper chamber in which an article carrier is charged with or discharged from the articles, a lower treatment chamber, and a device for raising and lowering the carrier. The carrier is provided with one or more plates with sealing peripheries engaging sealing collars, at least one of which is located between these chambers to seal the chambers from one another in at least one position of the carrier.

19 Claims, 3 Drawing Figures

4,471,792

APPARATUS FOR THE TREATMENT OF ARTICLES WITH A VOLATILE LIQUID

CROSS REFERENCE TO RELATED APPLICATIONS

This application is related to my copending application Ser. No. 256,599 of Apr. 22, 1981 now U.S. Pat. No. 4,390,396 which, in turn, was copending with an application which matured into U.S. Pat. No. 4,313,323 of Oct. 12, 1982.

FIELD OF THE INVENTION

My present invention relates to an apparatus for the treatment of articles, especially metal articles, with a vaporizable liquid, e.g. a degreasing solvent. More particularly, the invention relates to the solvent treatment of metal articles in bulk in a system in which the articles are lowered while contained in a basket into the solvent or treatment chamber.

BACKGROUND OF THE INVENTION

In the treatment of metal articles with solvents or solvent vapors, e.g. in the degreasing of such articles, the articles may be collected in a basket and lowered into a treatment chamber which can contain the solvent which is to be used for the treatment and, if desired, a heating device for vaporizing the solvent or raising the temperature thereof.

The apparatus for this purpose can comprise an upper chamber serving as a charging and discharging chamber and located above the lower chamber which serves as the treatment chamber.

The metal articles which are treated in this fashion can include pipes, pipe fittings, screw machine products and other mass produced or serially fabricated, finished, semi-finished and raw articles which may have residues of machining liquids, greases, oils, chips and filings adherent thereto.

The apparatus can also be utilized for the cleaning, degreasing or scouring of ceramic or glass articles.

In drycleaning, dye-setting or the like it is frequently desirable to contact textile fabrics, e.g. piece-goods, garments or other fibrous, web-forming or filamentary material with solvents or solvent vapors. In such cases as well the material may be placed in a basket and contacted with solvent or solvent vapors in a treatment chamber.

In general, when a charging and discharging space or chamber is provided in addition to the treatment chamber, the treatment chamber is not sealed off or, for that matter, sealed from the charging and discharging chamber so that during charging and discharging solvent vapors can emerge, e.g. through a door or opening through which the basket can be charged with the articles or the articles can be removed from the basket.

To prevent solvent escape it is known to provide solvent-treatment machines which an evacuator or the like for carrying off the vapors. The pumps and/or blowers utilized for this purpose are expensive and increase the capital and operating cost of the solvent treatment unit.

In general, therefore, one of the major disadvantages or drawbacks of these earlier solvent treatment systems is that material exchange between the charging and/or discharging space and the treatment space can occur generally unimpeded.

OBJECTS OF THE INVENTION

It is the principal object of the present invention to provide an improved apparatus for the solvent treatment of articles which can facilitate the charging and discharging of the apparatus and yet minimize the escape of solvents into the surroundings.

Another object of the invention is to overcome the aforedescribed disadvantages in a low cost and economically operated system.

Still another object of this invention is to provide an apparatus of the type described which will preclude significant escape of solvent into the environment through the open door of the charging and discharging compartment.

SUMMARY OF THE INVENTION

These objects and others which will become apparent hereinafter are attained, in accordance with the present invention, by providing the carrier with a lower closure plate on its underside which cooperates sealingly with the lower portion of the upper or charging/discharging chamber when this carrier is in its raised position to practically seal off the solvent treatment chamber and thereby prevent escape of solvent vapors from the latter during the charging and discharging process.

More specifically, the present invention provides an apparatus for the solvent treatment of articles which comprises means forming a treatment chamber adapted to receive a solvent and to treat articles lowered into this chamber on a carrier, a charging and discharging chamber from above the treatment chamber and adapted to receive the carrier when the latter is raised, this chamber being formed with a door through which the carrier can be charged with the articles and the articles can be removed from the carrier and the aforementioned closure plate on the underside of the carrier or basked with a periphery which corresponds substantially to the cross section of the lower portion of the charging and discharging chamber so that the sealing collar is formed at this lower portion when the carrier is raised into the charging and discharging chamber.

The sealing of the treatment chamber can be effected in various ways. For example, a metal-to-metal seal can be provided by annular portions of the sealing plate and the passage through which the carrier passes or one of these members can be provided with a metallic sealing member while the other is formed with a soft or yieldable (e.g. elastomeric) sealing member.

A third alternative is that both of the mutually engaging annular members are soft, yieldable, flexible or elastic members. In all cases, the seal-forming member should be resistant to chemical or physical attack by the solvent and thus should be corrosion-resistant and incapable of being dissolved by the solvent.

One of the sealing members can be a sealing shoulder which can abut a sealing collar or the two sealing members may simply press against one another in an annular seal. The sealing collar, in the latter case, may constitute a cylinder with the other sealing member being raised and lowered therein in the manner of a piston.

In this latter embodiment, which constitutes a preferred embodiment of the invention, the article carrier can also be provided with an upper plate formed with an upper sealing member engageable with the sealing cylinder to seal the latter against the escape of the solvent as the basket is lowered. Naturally, the height of the basket or the spacing between the two plates and/or the displacement of the carrier between its upper and lower positions, i.e. the stroke, can be selected so that an effective seal is formed both in the upper position and in the lower position of the basket.

It has also been found to be advantageous, according to another feature of the invention, to provide a seal with the upper plate in the upper position of the basket or carrier thereby defining the space in the upper compartment which is closed at top and bottom sealingly and which hence can be readily evacuated, e.g. for the drying treatment of the product when it is desired to draw air through the latter.

Of course, an additional chamber can be provided for the drying operation, preferably between the charging-/discharging chamber and the treatment chamber. In the latter case, this additional chamber is provided between cylindrical sealing surfaces above and below it which cooperate with the annular seals of the upper and lower plates to seal the additional chamber off so that air can be drawn through the basket before it is raised to the charging and discharging station.

The system of the invention, therefore, can maintain the treatment chamber and/or the additional chamber and even the charging and discharging chamber sealed against the atmosphere merely upon movement of the article carrier into its various positions, thereby precluding the escape of solvent vapors into the environment. In fact, a door capable of sealing the charging and discharging chamber is not even necessary.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 2:
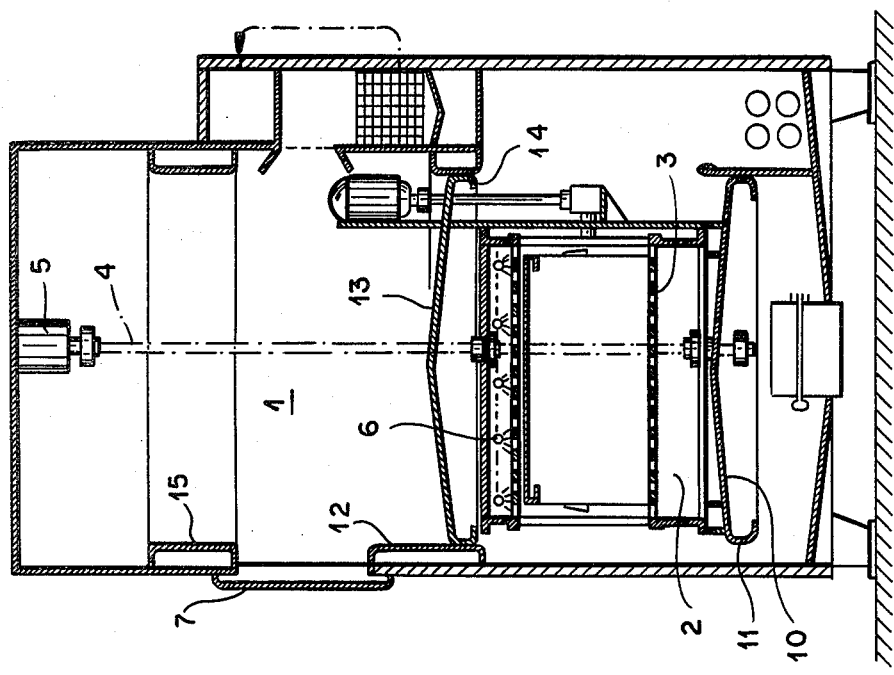
FIG. 2 is a section similar to FIG. 1 but showing the article-carrying basket in another position.
Figure 1:
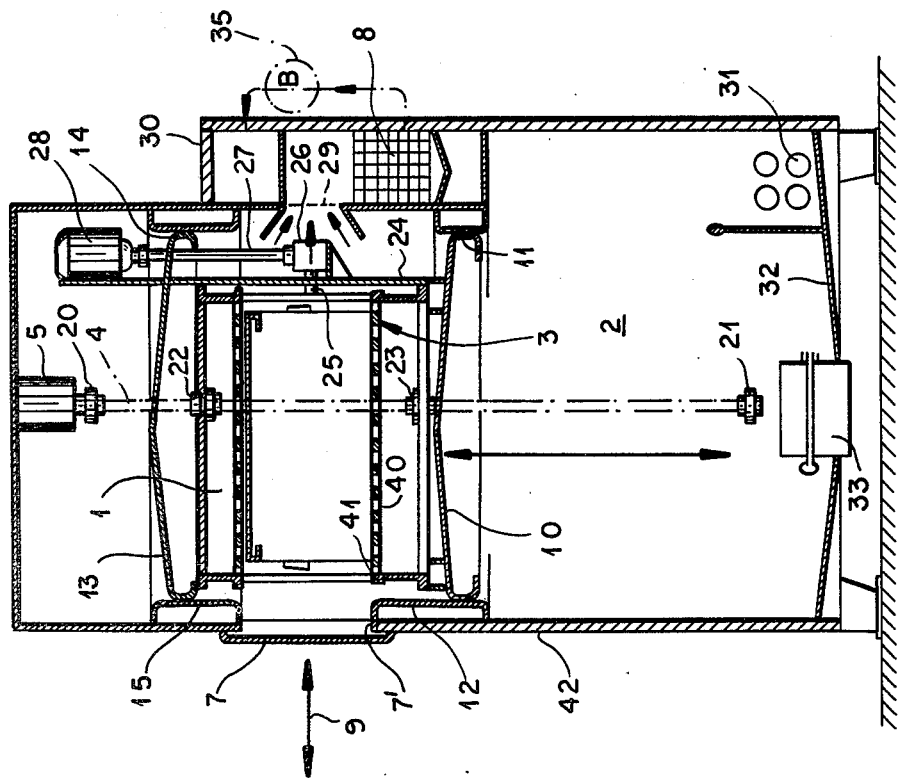
FIG. 1 is a vertical section through an apparatus according to the invention.

In FIGS. 1 and 2 of the drawing I have shown an apparatus for the solvent treatment of articles, especially metal articles although other types of articles as previously described can also be treated with this apparatus, wherein an upper chamber is disposed over a lower chamber. An article carrier 3 can be shifted up and down along a path so that it can be received in the charging and discharging chamber 1 (FIG. 1) or in the treatment chamber 2 therebelow (FIG. 2).

The article carrier 3 itself may comprise a carriage 24 having nuts 22 and 23 spaced apart along a lead screw 4 journaled in bearings 20 and 21 and driven by a motor 5. The lead screw and its associated parts have been represented in dot-dash lines to show that these parts are not in the plane of the section in FIG. 1 or FIG. 2.

In the upper position, the article carrier 3 has a basket 40 with an open end 41 aligned with an opening 7' in a front wall 42 of the apparatus. The opening can be closed with a door 7 having a peripheral seal as is conventional with such means for preventing escape of the vapor from the apparatus.

When the basket is in its lower position (FIG. 2), it can be raised and lowered slightly during the treatment, thereby bringing about relative displacement of the articles and any liquid solvent in contact therewith.

The floor 33 of the lower chamber can be provided with means in the form of an agitator 32 for swirling the liquid around and heater 31 can be provided to raise the temperature of the solvent and/or generate solvent vapors when treatment of the articles with the vapor is desired.

It has also been found to be advantageous to tumble the articles in contact with the solvents or during drying and for this purpose the holder carriage 24 is provided with a motor 28 whose shaft 27 operates a worm drive 26 rotating the shaft 25 by which the basket is journaled on a rear wall of this carriage.

The carrier and/or the chamber 2 can be provided with spray devices as represented at 6 for contacting the tumbling articles with the solvent. When the spray devices are on the walls of the chamber 2, they can be connected by a pump and fixed piping to the sump formed on the floor 32 for circulation of the solvent, whereas, when the nozzles are provided on the article carrier, a flexible hose can connect this pump to the spray nozzle.

The upper chamber is advantageously formed with a unit shown as a grill 8 and a blower 35 for circulating drying air in the direction of arrow 9, drying air entering the drum from another grill not shown. The air circulation path may include a condenser (not shown) as is conventional in solvent treatment machines for recovering solvents from the drying air and returning it for example to the lower chamber. Charging and discharging are represented by the double head arrow 9 and can be effected when the door is opened.

At its lower side, the carrier 3 is provided with a closure plate 10 which extends over the cross section of the chamber 1 and is formed with a lower annular sealing surface 11 which can be composed of metal or rubber resistant to attack by the solvent.

Between the chambers 1 and 2, a circular sealing collar 12 is provided which forms a cylinder sealingly engaged by the piston-like member 10 and its seal 11.

Thus, when the plate 10 is raised into the collar 12, the lower chamber 2 is sealed from the upper chamber and vapors from the lower chamber cannot enter the atmosphere even when the door 7 is opened.

It has been found to be advantageous, moreover, to provide an upper plate 13 on the carrier 3 and to dimension spacing between these plates and the stroke of the basket so that the sealing surface 14 of the upper plate sealingly engages the collar 12 when the basket is lowered (FIG. 2). This maintains a sealing separation of the two chambers during the treatment when the solvent is most vigorously heated and agitable and loss of vapor may be most pronounced. Furthermore, this allows the door 7 to be eliminated entirely or permits this door to be opened during the treatment process.

It has been found to be advantageous, moreover, to provide a further collar 15 above the door for engagement by the upper seal 14 when the basket is raised (FIG. 2), thereby sealing off the space above the basket and minimizing release of any vapor which may have accumulated in this space.

Thus only a limited volume is open to the atmosphere when the door is opened.

In operation, the solvent is introduced into the lower chamber 2 through any conventional piping system (not shown) and remains there until contaminated to the point that discard or distillation is necessary.

The goods or articles to be treated are introduced into the basket 40 in the upper position of the carrier 3

(FIG. 1) and the tumbling action is initiated immediately. The carrier is then lowered (FIG. 2), thereby seaing the treatment chamber 2 with the upper seal 14 while the articles are contacted with the solvent. When degreasing is complete, the carrier is raised and the treatment chambers thereby sealed off by the lower plate and the articles are discharged.

Figure 3:
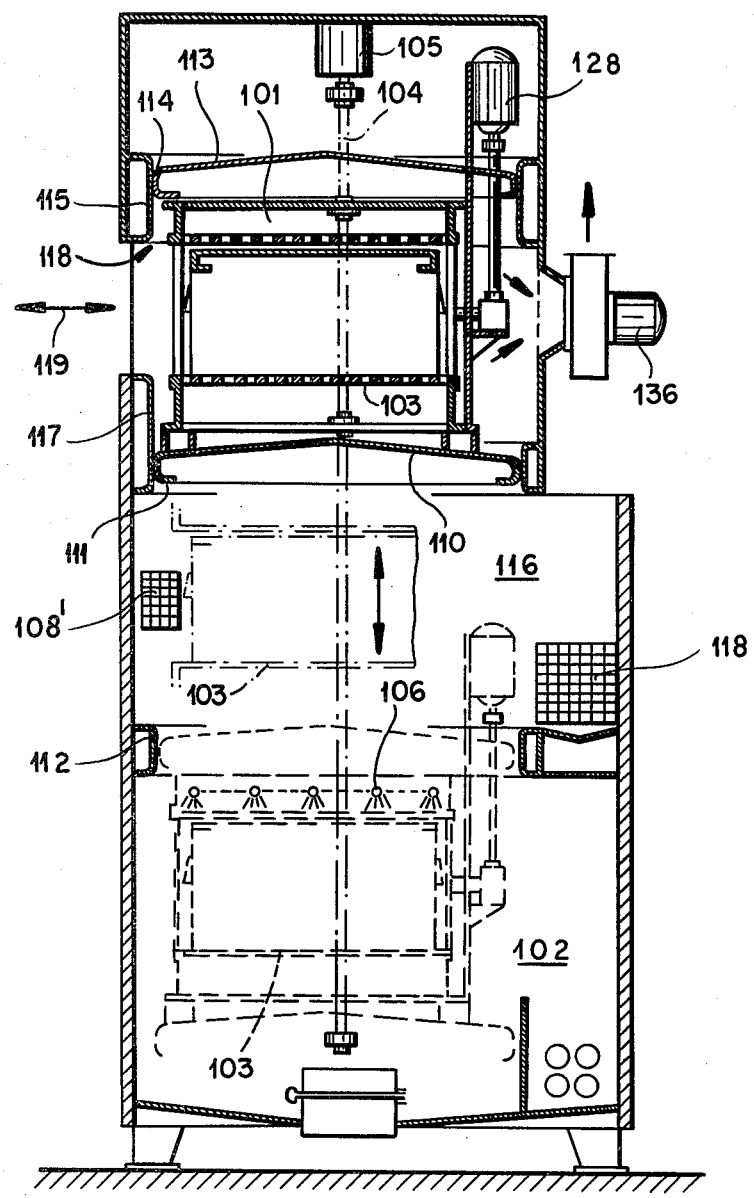
FIG. 3 is a vertical section through another embodiment of the invention.

In FIG. 3 I have shown another embodiment of the invention wherein an additional chamber 116 is provided between the upper chamber 101 and the lower chamber 102. The three possible positions of the carrier 103 have been shown in dot-dash and solid lines in this Figure.

As seen in solid lines, the basket of the carrier 103 is aligned with the continuously open door 118 through which the basket can be charged and discharged. A blower 136 can continuously draw air in through this door. In this position, the upper plate 113 has a peripheral seal 114 engaging the collar 115 while the lower seal 111 of the plate 110 engages the lower collar 117.

The basket, charged with the articles, can be lowered by motor 105 and threaded spindle 104 into the treatment chamber 102, i.e. into the lowermost position shown in which the treatment chamber is sealed by engagement of the upper seal 114 with a collar 112 directly above this treatment chamber and between this treatment chamber and the additional chamber 116.

After the motor 128 has tumbled the articles in the basket in contact with the solvent for a sufficient time, the basket is raised to its position shown in the intermediate chamber in which the lower seal 111 engages the collar 112 and the upper seal 114 engages the collar 117. This seals off the additional chamber 116 and permits it to be used for the circulation of hot air through the basket, e.g. by withdrawing the air from register 108 and reintroducing it via register 108' to dry the articles by evaporating the solvent therefrom. Only then is the basket raised to its upper position. During all of these operations, because of the sealing achieved by plates 110 and 113, the door 118 can remain open and air drawn therethrough. In this embodiment as well a double headed arrow 109 represents charging and discharging of the drum.

I claim:

1. An apparatus for the treatment of articles with a solvent comprising:
   means forming a lower treatment chamber adapted to receive a solvent for treatment of said articles therewith;
   means forming an upper charging and discharging chamber above said treatment chamber;
   an article carrier receivable in said chambers;
   means for displacing said carrier along a path from an upper position in which said carrier is disposed in said upper chamber to receive and discharge articles into a lower position in which said carrier is disposed in said lower chamber for treatment of said articles with said solvent;
   a sealing collar disposed around the path of said carrier between said upper chamber and said treatment chamber; and
   a sealing plate on said carrier having a sealing periphery engaging said collar in said upper position of said carrier whereby said plate and said collar seal said chambers from one another during charging and discharging of said articles.

2. The apparatus defined in claim 1 wherein the first mentioned plate is provided on an underside of said carrier, further comprising a second sealing plate on an upper side of said carrier forming a peripheral seal with said collar when said carrier is in said lower position for treatment of said articles.

3. The apparatus defined in claim 1, further comprising another sealing collar at an upper portion of said upper chamber for engagement by the seal of said second plate in said upper position of said carrier.

4. The apparatus defined in claim 2, further comprising means defining an intermediate chamber between said upper and lower chambers, one such collar being disposed between said treatment chamber and said further chamber and another such collar being disposed between said further chamber and said upper chamber whereby said plates seal against said collars when said carrier is disposed intermediate said upper and treatment chambers for drying of said articles.

5. The apparatus defined in claim 1 wherein said collar is formed with a cylindrical surface engageable by the sealing periphery of said plate in a piston-and-cylinder sealing arrangement.

6. The apparatus defined in claim 2 wherein each of said collars is formed with a cylindrical surface engageable by the sealing periphery of the respective plate in a piston-and-cylinder sealing arrangement.

7. The apparatus defined in claim 1 wherein said article carrier comprises a vertically displaceable carriage, an article-receiving drum on said carriage, and means on said carriage for rotating said drum.

8. The apparatus defined in claim 7 wherein said means for displacing said carrier includes a threaded spindle connected to said carriage, and a motor for driving said spindle.

9. The apparatus defined in claim 8, further comprising means for ventilating said upper chamber.

10. The apparatus defined in claim 2 wherein said article carrier comprises a vertically displaceable carriage, an article-receiving drum on said carriage, and means on said carriage for rotating said drum.

11. The apparatus defined in claim 10 wherein said means for displacing said carrier includes a threaded spindle connected to said carriage, and a motor for driving said spindle.

12. The apparatus defined in claim 11, further comprising means for ventilating said upper chamber.

13. An apparatus for the treatment of articles with a solvent comprising:
   means forming a lower treatment chamber adapted to receive a solvent for treatment of said articles therewith;
   means forming an upper charging and discharging chamber above said treatment chamber;
   an article carrier receivable in said chambers;
   means for displacing said carrier along a path from an upper position in which said carrier is disposed in said upper chamber to receive and discharge articles into a lower position in which said carrier is disposed in said lower chamber for treatment of said articles with said solvent;
   a sealing collar disposed around the path of said carrier between said upper chamber and said treatment chamber; and
   a sealing plate on an upper portion of said carrier having a sealing periphery engaging said collar in said lower position of said carrier whereby said plate and said collar seal said chambers from one another during the treatment of said articles.

14. The apparatus defined in claim 13, further comprising another sealing collar at an upper portion of said upper chamber for engagement by the sealing periphery of said plate in said upper position of said carrier.

15. The apparatus defined in claim 14, further comprising means defining an intermediate chamber between said upper and lower chambers, one such collar being disposed between said treatment chamber and said further chamber and another such collar being disposed between said further chamber and said upper chamber.

16. The apparatus defined in claim 13 wherein said collar is formed with a cylindrical surface engageable by the sealing periphery of said plate in a piston-and-cylinder sealing arrangement.

17. The apparatus defined in claim 1 wherein said article carrier comprises a vertically displaceable carriage, an article-receiving drum on said carriage, and means on said carriage for rotating said drum.

18. The apparatus defined in claim 17 wherein said means for displacing said carrier includes a threaded spindle connected to said carriage, and a motor for driving said spindle.

19. The apparatus defined in claim 18, further comprising means for ventilating said upper chamber.

* * * * *

UNITED STATES PATENT AND TRADEMARK OFFICE
CERTIFICATE OF CORRECTION

PATENT NO. : 4,471,792
DATED : September 18, 1984
INVENTOR(S) : Heinz Koblenzer

It is certified that error appears in the above-identified patent and that said Letters Patent is hereby corrected as shown below:

On the title page the following should be added:

-- [30] Foreign Application Priority Data
Nov. 24, 1981 [DE] Fed Rep Germany.......31 46 474--.

Signed and Sealed this

Fifth Day of March 1985

[SEAL]

Attest:

DONALD J. QUIGG

Attesting Officer     Acting Commissioner of Patents and Trademarks